(12) United States Patent
Drennan et al.

(10) Patent No.: US 10,935,594 B1
(45) Date of Patent: Mar. 2, 2021

(54) CURVE TRACE ANALYSIS TESTING APPARATUS CONTROLLER

(71) Applicant: Priority Labs, Inc., Richardson, TX (US)

(72) Inventors: Monte Drennan, Parker, TX (US); Craig Ward, Allen, TX (US); Scott Lisula, Dallas, TX (US); Kenny Keese, Rowlett, TX (US); John Drummond, Allen, TX (US)

(73) Assignee: Priority Labs, Inc., Richardson, TX (US)

( * ) Notice: Subject to any disclaimer, the term of this patent is extended or adjusted under 35 U.S.C. 154(b) by 0 days.

(21) Appl. No.: 14/937,585

(22) Filed: Nov. 10, 2015

Related U.S. Application Data

(60) Provisional application No. 62/077,400, filed on Nov. 10, 2014.

(51) Int. Cl.
*G01R 31/28* (2006.01)

(52) U.S. Cl.
CPC .................. *G01R 31/2834* (2013.01)

(58) Field of Classification Search
CPC .............. G01R 31/2834; G01R 31/317; G01R 31/31723; G01R 31/31813; G01R 31/31926; G01R 31/31905; G01R 31/2889; G01R 31/31903; G01R 31/318516; G01R 31/31907; G01R 31/3191; G01R 31/31924; G01R 31/2601; G01R 31/2621; G01R 31/2637; G01R 31/2808; G01R 31/281; G01R 31/2844; G01R 31/2886; G01R 31/308; G01R 31/3167; G01R 31/3171; G01R 31/31715; G01R 31/31716; G01R 31/318533; G01R 31/31912; G01R 31/31928; G01R 35/005; G01R 35/00; G01R 19/00; G01R 1/0408; G01R 1/0466; G01R 1/206; G01R 27/2605; G01R 1/07385; G01R 1/045; G01R 1/0483; G01R 1/07314; G01R 31/00; G01R 31/28; G01R 31/3832; G01R 31/2836; G01R 31/2837; G01R 31/2841; G01R 31/2846; G01R 31/2851; H01L 2924/0002; H01L 2924/00; H01L 2924/15311; H01L 2224/16225; H01L 22/34; H01L 23/5382
See application file for complete search history.

(56) References Cited

U.S. PATENT DOCUMENTS 3,854,125 A * 12/1974 Ehling ............. G01R 31/31926
714/27
4,070,565 A * 1/1978 Borrelli ............ G01R 31/31915
702/120

(Continued)

*Primary Examiner* — Lee E Rodak
(74) *Attorney, Agent, or Firm* — Shiells Law Firm P.C.; Theodore F. Shiells

(57) ABSTRACT

A curve trace analysis testing apparatus controller is provided having a Graphical User Interface electrically connected to a Device Under Test (DUT) by any pin or combination of pins, the DUT being mountable to independent analog channels in the TAC using an electrical connection interface. The TAC can contain 3 different board assemblies: a System Motherboard, a Microprocessor assembly, and TAC Modules. The TAC Modules can have TAC shift registers and solid state switches, and each TAC Module can support a block of pins and at least 2 analog channels.

4 Claims, 2 Drawing Sheets

(56) References Cited

U.S. PATENT DOCUMENTS

| | | | | |
|---|---|---|---|---|
| 4,746,855 | A * | 5/1988 | Wrinn | H04M 3/26 |
| | | | | 324/763.01 |
| 5,124,638 | A * | 6/1992 | Winroth | G01R 31/2834 |
| | | | | 324/73.1 |
| 7,174,490 | B2 * | 2/2007 | Evans | G01R 31/31903 |
| | | | | 324/756.07 |
| 2005/0237073 | A1 * | 10/2005 | Miller | G01R 1/07385 |
| | | | | 324/756.03 |
| 2010/0213960 | A1 * | 8/2010 | Mok | G01R 35/00 |
| | | | | 324/762.03 |
| 2010/0231254 | A1 * | 9/2010 | Lou | G01R 31/2889 |
| | | | | 324/756.03 |

* cited by examiner

CURVE TRACE ANALYSIS TESTING APPARATUS CONTROLLER

FIELD OF THE INVENTION

The present invention relates to automated or semi-automated testing equipment and, in particular, to a curve trace analysis (CTA) testing apparatus controller (TAC) that employs a Graphical User Interface (GUI) to electrically connect any pin or combination of pins from a Device Under Test (DUT) that is mounted in an appropriate electrical connection interface to independent analog channels in the TAC, automatically or under user control.

SUMMARY OF THE INVENTION

In one embodiment of the present invention, a curve trace analysis (CTA) testing apparatus controller (TAC) is provided having a Graphical User Interface (GUI) electrically connected to a Device Under Test (DUT) by any pin or combination of pins, the DUT being mountable to independent analog channels in the TAC using an electrical connection interface.

In another aspect of this embodiment, the TAC contains 3 different board assemblies: a System Motherboard, a Microprocessor assembly, and TAC Modules. The TAC Modules have TAC shift registers and solid state switches, and each TAC Module supports a block of pins and at least 2 analog channels.

BRIEF DESCRIPTION OF THE DRAWINGS

For a more complete understanding of the present invention and the advantages thereof, reference is now made to the following Detailed Description taken in conjunction with the accompanying drawings, wherein.

DETAILED DESCRIPTION

Figure 1:
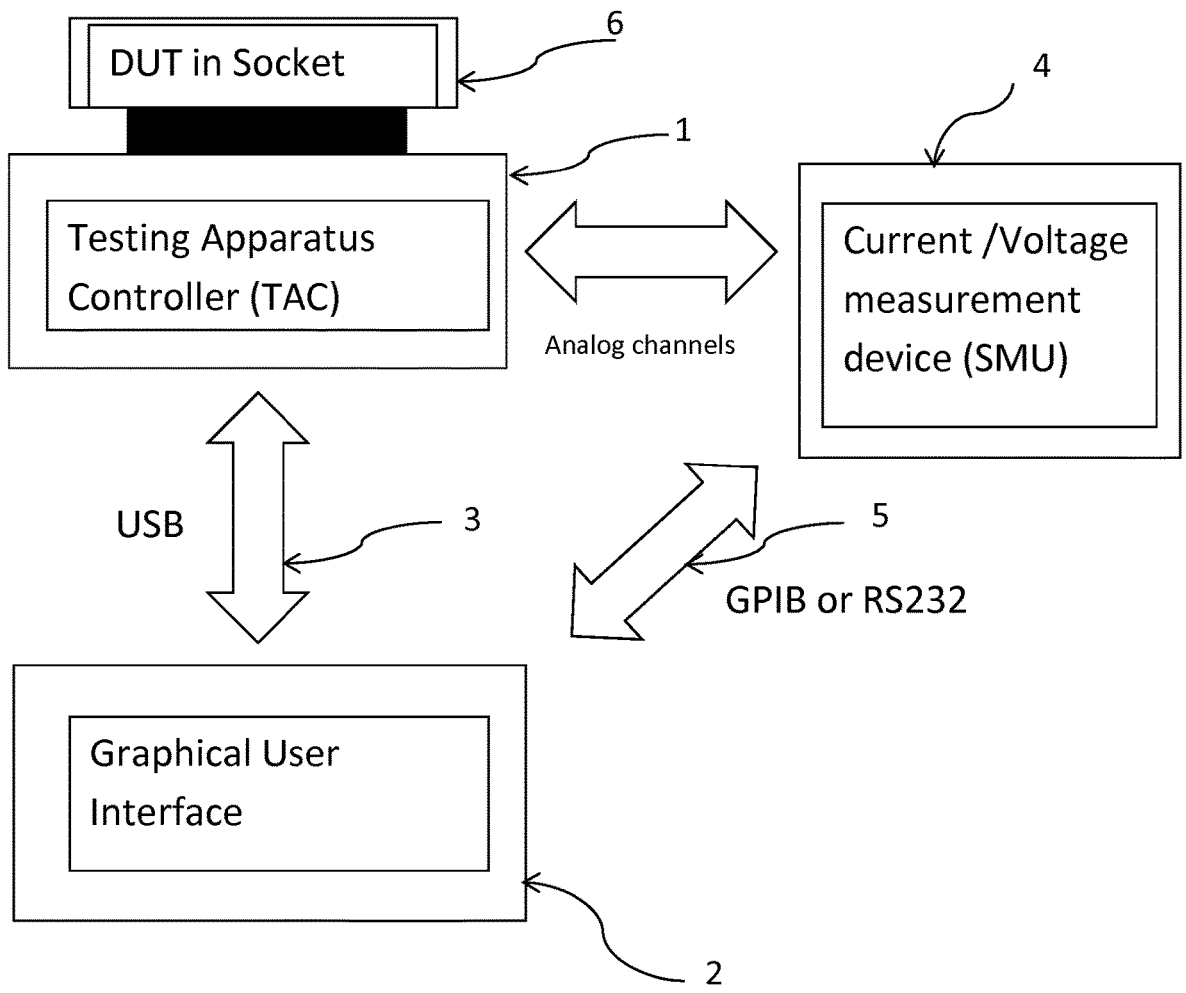
FIG. 1 depicts a block diagram showing connection of TAC, DUT, GUI, and Current/Voltage measurement device.
Figure 2:
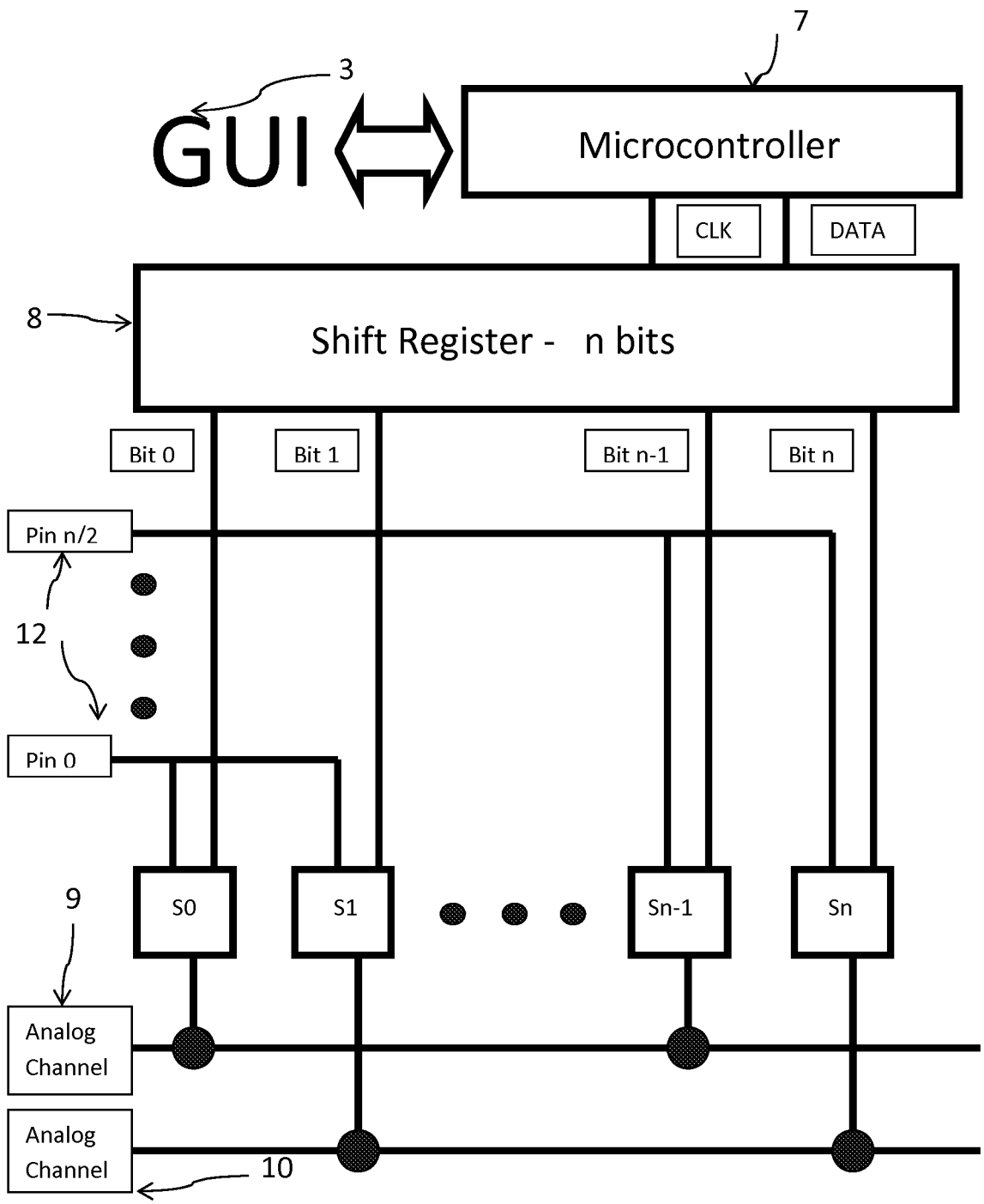
FIG. 2 depicts a block diagram showing internal construction of TAC for two analog channels.

Referring now to the drawings in detail, and initially to FIG. 1 therefor, in one embodiment of the CTA, the TAC 1 communicates with the GUI 2 through either a RS-232 serial connection 5 or USB 3. The TAC 1 can have an embedded microcontroller 7 (shown in FIG. 2) that controls the solid state switches used to connect the DUT 6 pins 12 to the Source Measurement Unit 4 (SMU) for current/voltage measurements. The solid state switches can be controlled by a serial shift register 8 with each location on the serial shift register uniquely connecting a specific solid state switch to the DUT 6 pin 12 (FIG. 2).

Each pin 12 can be assigned a single bit for each channel in the TAC 1. Based on the User's GUI 2 selections, an ASCII character string representation of the relay states can be produced by stringing all the control bits for each pin together. This method of developing an ASCII string to control the connections in the TAC 1 provides for $2^{N*C}$ unique connection possibilities to the DUT 6, where N is the number of Pins and C is the number of analog channels 9 and 10. The GUI 2 is required for making all DUT 6 pin connections. These unique combinations of pin connections can include, but are not limited to:

A single DUT 6 pin connected to one channel and all other DUT 6 pins connected to the second channel.

A single DUT 6 pin connected to one channel and a different single DUT 6 pin connected to the second channel with all other DUT 6 pins not connected to either channel.

A set of user defined groups of DUT 6 pins connected to one channel and a second set of user defined DUT 6 pins connected to a second channel.

In one embodiment, the physical construction and configuration of the TAC 1 contains 3 different board assemblies: the System Motherboard, the Microprocessor assembly, and TAC Modules. Each of these assemblies can be readily replaced independently of the others for repair, if required, or to comply with normal calibration cycles.

The number of Pins and Channels can be configured by the System Motherboard. Two different TAC configurations would be distinguished by the System Motherboard and the physical case housing the TAC 1. The System Motherboard can connect the serial shift registers 8 from each TAC module in series and provide connectivity to the DUT 6 socket interface. The TAC Modules can contain the shift registers 8 and solid state switches. All TAC modules can follow the same shift register 8 and solid state relay architecture. Cost and Assembly hardware can be minimized by modeling the TAC Modules after the JEDEC MO-269 Standard.

Each TAC module can support a block of pins 12 and at least 2 analog channels 9 and 10, though any larger number of analog channels can also be employed. The Microprocessor assembly is the incorporation of a commercially available development board that is loaded with TAC firmware and directly plugged into the System Motherboard.

Automatic control through the GUI 2 provides management of timing, instrument communication, and data to perform multiple current/voltage measurement sequences.

The GUI 2 can control all communications with the embedded microcontroller 7. Communication between the GUI 2 and the TAC 1 can follow two different patterns:

Query/Response

Query/Response/Data/Confirmation

This configuration prevents communication errors and ensures that the TAC 1 is always in the proper state before the GUI 2 notifies the SMU 4 or the User that a state is achieved. In one embodiment, the ASCII string describing the desired set of shift register 8 relay states is the only data that passes from the GUI 2 to the TAC 1. This ASCII string can be a single string representing every shift register bit in the system, or it can be compressed to reduce the ASCII strings to define the changes between the current state and the next desired state. Once confirmation is received from the TAC 1, the IN measurement is taken and the next ASCII string will be sent. In manual mode, the user will be notified that the state is achieved and unique tests and measurements can be made.

All measurement data is received by the GUI 2 directly from the SMU 4. The SMU 4 is controlled through a General Purpose Interface Bus (GPIB) or RS232 serial bus. The TAC 1 system can utilize commercially available SMUs. This prevents the need for a unique calibration process for the TAC 1. The SMU 4 can be easily swapped with another unit in order to comply with normal calibration cycles without adding down time to the TAC 1 system.

When the GUI 2 is not actively controlling the TAC 1 connection states, it is in an idle mode. During the idle mode it is available to configure the next DUT 6, and it allows for viewing collected data. Data can be collected and stored under multiple devices. The number of devices is limited by computer resources. Each device that has collected data can have pin data overlaid in the graph for comparative analysis.

Comparisons can be made between pins 12 on a single device or between different devices. Computer resources are the only limit to the number of traces that can be overlaid. The collected data and plots can be saved as JPEG images for reports or as a data file for later viewing.

Summary of Main Features of an Embodiment of the TAC

Low resistance connection of any DUT 6 pin to independent channels.

Architecture scalable to any DUT 6 pin numbers required.

Architecture scalable to any number of channels required.

Calibration of external IN measurement device does create down time for TAC 1 system since the GUI 2, SMU 4 and TAC Modules are separate devices that can be independently calibrated or replaced for repairs.

Summary of Main Features of an Embodiment of the GUI:

Intuitive control of connection from DUT 6 in socket to current/voltage measurement device.

Controls testing of a single DUT 6 pin 12 with respect to all other pins 12.

Controls testing of two or more DUT 6 pins 12 to each other.

Control current/voltage measurement device to set ranges and limits of current and voltage for DUT 6 testing.

Manage current/voltage measurements for display, storage, and comparison.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

We claim:

1. A curve trace analysis (CTA) testing apparatus controller (TAC) comprising:
   a Graphical User Interface (GUI), said GUI being electrically connected to a Device Under Test (DUT) by any pin or combination of pins, the DUT being mountable to independent analog channels in the TAC for said curve trace analysis using an electrical connection interface,
   wherein there are $2^{N*C}$ unique control connection American Standard Code for Information Interchange (ASCII) character strings for the DUT, a voltage state for each pin, and at least two analog channels, wherein said ASCII character strings are based upon selections made within the GUI,
   wherein N is the number of pins of said TAC and C is the number of analog channels;
   a microprocessor;
   a shift register clocked by said microprocessor to shift said $2^{N*C}$ unique control connection ASCII character strings, and
   a plurality of pairs of solid-state switches, wherein each solid-state switch of each pair of solid-state switches is coupled to its own corresponding shared output connection to generate a conveyed output voltage state for said each pin as derived from said each pin and said ASCII character strings,
   wherein a corresponding binary control state for each pin is conveyed from the shift register, said corresponding binary control states each determining whether a voltage output of said pin or each of said combination of pins as coupled through said pair of solid state switches or plurality of pairs of solid-state switches, respectively, is conveyed to said at least two analog channels, respectively through the shared output connection of each said pin or each of said combination of pins, to generate the conveyed output voltage state;
   wherein each corresponding shared output connection is shared only among each solid-state switch of each pair of solid-state switches.

2. The TAC of claim 1, wherein the voltage state is a binary voltage state.

3. A curve trace analysis (CTA) testing apparatus controller (TAC) comprising:
   a Graphical User Interface (GUI), said GUI being electrically connected to a Device Under Test (DUT) by any pin or combination of pins, the DUT being mountable to independent analog channels in the TAC for said curve trace analysis using an electrical connection interface means,
   wherein there are $2^{N*C}$ unique control connection American Standard Code for Information Interchange (ASCII) character strings for the DUT, a voltage state for each pin, and at least two analog channels, wherein said ASCII character strings are based upon selections made within the GUI,
   wherein N is the number of pins of said TAC and C is the number of analog channels;
   a microprocessor means for clocking;
   a shift register clocked by said microprocessor means for clocking to shift said $2^{N*C}$ unique control connection ASCII character strings, and
   a plurality of pairs of solid-state switches, wherein each solid-state switch of each pair of solid-state switches is coupled to their own corresponding shared output connection to generate a conveyed output voltage state for said each pin as derived from said each pin and said ASCII character strings,
   wherein a corresponding binary control state is conveyed from the shift register, said binary control states each determining whether a voltage output of said pin or each of said combination of pins as coupled through said pair of solid state switches or plurality of pairs of solid-state switches, respectively, is conveyed to said at least two analog channels, respectively, through the shared output connection of each said pin or each of said combination of pins, to generate the conveyed output voltage state;
   wherein each corresponding shared output connection is shared only among each solid-state switch of each pair of solid-state switches.

4. A curve trace analysis (CTA) testing apparatus controller (TAC) comprising:
   a Graphical User Interface (GUI) means, said GUI means being electrically connected to a Device Under Test (DUT) by any pin or combination of pins, the DUT being mountable to independent analog channels in the TAC for said curve trace analysis using an electrical connection interface means,
   wherein there are $2^{N*C}$ unique control connection American Standard Code for Information Interchange (ASCII) character strings for the DUT, a binary voltage state for each pin, and at least two analog channels, wherein said ASCII character strings are based upon selections made within the GUI, wherein N is the number of pins of said TAC and C is the number of analog channels;

a microprocessor means for clocking;

a shift register clocked by said microprocessor means for clocking to shift said $2^{N*C}$ unique control connection ASCII character strings, and a plurality of pairs of solid-state switches, wherein each solid-state switch of each pair of solid-state switches is coupled to their own corresponding shared output connection to generate a conveyed output binary voltage state for said each pin as derived from said each pin and said ASCII character strings, wherein a corresponding binary control state is conveyed from the shift register, said binary control states each determining whether a voltage output of said pin or each of said combination of pins as coupled through said pair of solid state switches or plurality of pairs of solid-state switches, respectively, is conveyed to said at least two analog channels, respectively, through the shared output connection of each said pin or each of said combination of pins, to generate the conveyed output voltage state;

wherein each corresponding shared output connection is shared only among each solid-state switch of each pair of solid-state switches.

* * * * *